United States Patent

[11] 3,610,752

[72] Inventor Frederick C. Wilson
Queens Village, N.Y.
[21] Appl. No. 3,152
[22] Filed Jan. 15, 1970
[45] Patented Oct. 5, 1971
[73] Assignee The United States of America as represented by the United States Atomic Energy Commission

[54] PREPARING PRINTED CIRCUIT BOARDS BY REFRACTED RAYS

5 Claims, 4 Drawing Figs.

[52] U.S. Cl. 355/77, 355/133, 355/125
[51] Int. Cl. G03b 41/00
[50] Field of Search 355/77, 125, 133; 96/36, 2

[56] References Cited
UNITED STATES PATENTS

| | | | |
|---|---|---|---|
| 2,014,513 | 9/1935 | Zimmerman | 355/133 |
| 3,204,544 | 9/1965 | Shannon | 355/133 |

*Primary Examiner*—John M. Horan
*Attorney*—Roland A. Anderson

ABSTRACT: An improved process for preparing printed circuit boards in which only the conductor surrounding the circuitry is removed. A refractor is utilized in preparing the circuit board negative to obtain exposure of the film only in the regions directly adjacent the lines representing the circuitry.

INVENTOR.
FREDERICK C. WILSON
BY
Attorney

INVENTOR.
FREDERICK C. WILSON
BY

PREPARING PRINTED CIRCUIT BOARDS BY REFRACTED RAYS

BACKGROUND OF THE INVENTION

The invention described herein was made in the course of work by an employee of the United States Atomic Energy Commission.

In the preparation of a printed circuit board by conventional procedure, a drawing of the printed circuit is prepared, photographed, and a photonegative prepared. Through the negative the board or panel coated with a light sensitive emulsion is exposed to light and processed, removing by chemical-etching techniques all of the conductive copper metal on the board except for the circuitry itself.

It has been discovered that if only the copper immediately surrounding the actual conductors is removed leaving a maximum amount of copper on the board between the isolated conductors to serve as an electrical ground there is an important reduction in the amount of unwanted feedback, interference, and undesirable capacitive effects present in the finished board. In addition the cost of photoetching is reduced because less chemical is actually used.

Printed circuit boards having etched insulated barriers isolating the conductors thus have been produced, utilizing the conventional technique described above. However, drafting time in the preparation of the drawings for such boards is increased considerably offsetting any possible saving arising from reduced chemical use and the result that the cost of preparing such boards is increased considerably.

In accordance with this invention, the aforementioned difficulty is overcome and other benefits are obtained as hereinafter described by utilizing a novel refracted photographic method of preparing the negative from which the coated board is etched to produce the final circuit board. In a preferred embodiment of the invention, a printed board master layout of the conductive pattern is prepared in any conventional manner. The master is photographed and a positive transparency is then made with the dimensions of the final circuit board. The positive transparency is then held in an enlarger easel and the negative is placed above in the negative carrier so that light from the negative is aligned with the positive transparency and there is a complete blockage of light from the enlarger. A sheet of unexposed film is then placed under the positive. A refractor is then inserted between the negative and the positive transparency. The refractor is tilted or shifted slightly in all directions with the result that the light is displaced but not distorted, exposing the film around the edges of the conductors as they appear on the positive. The result is a negative which has exposed lines outlining the conductors. This negative is then used to make the ground plane printed circuit boards with standard photoetching methods.

It is thus a principal object of this invention to provide an improved method of preparing printed circuit boards having insulated barriers isolating the conductors.

Other objects and advantages of this invention will hereinafter become obvious from the following description of a preferred embodiment of this invention.

DESCRIPTION OF THE PREFERRED EMBODIMENT

Figure 1:
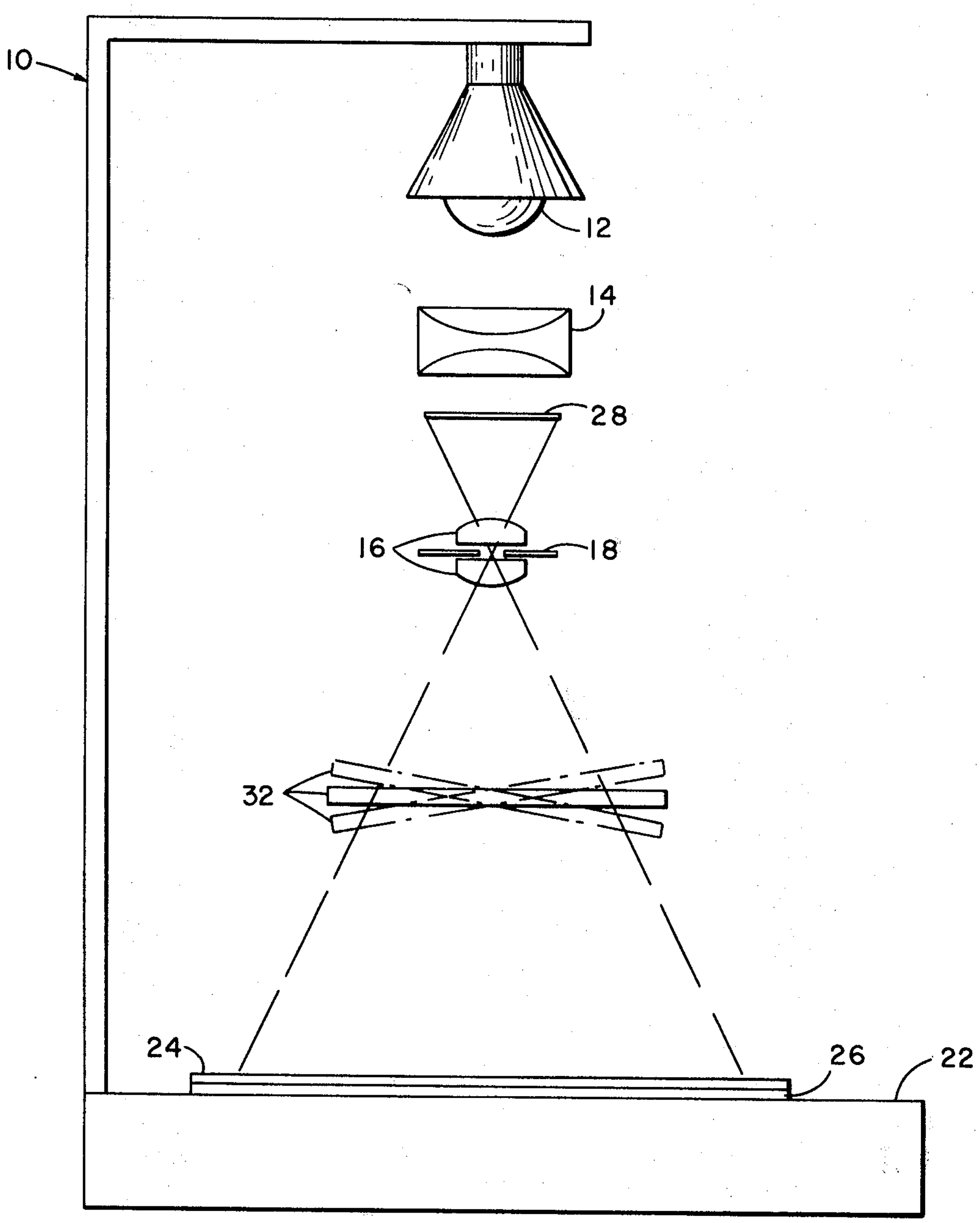
FIG. 1 illustrates a partially schematized arrangement for carrying out a preferred embodiment of this invention.

In the preparation of a printed circuit board in accordance with the principles of this invention, a master layout of the conductive pattern is first prepared. This may be in the form of an ink drawing or strips of tape pasted on a sheet showing the desired circuit configuration. Upon completion of the master layout, the latter is photographed, producing a negative. A photonegative or positive transparency of the circuit layout is then prepared from the negative. This could be prepared in suitable enlarger apparatus, such as enlarger 10 shown in FIG. 1. As shown in FIG. 1, enlarger 10 consists of a source 12 of light, a light condenser 14, projection lens 16, a diaphragm 18, and a table 22.

After the transparency is developed, the latter, identified with the numeral 24, is mounted back in enlarger 10, on table 22. Beneath transparency 24 is slipped a sheet of unexposed film 26.

Negative 28, taken from the master layout as described above, is mounted in enlarger 10 in a conventional manner as shown, so that the combination of negative 28 and positive transparency 24 will block all light to the sheet of unexposed film 26.

A refractor 32 is mounted in any suitable fashion between lens 16 and transparency 24, in such a way that it may be titled back and forth as shown in phantom. Refractor 32 may be a flat sheet of glass, a transparent plastic such as plexiglass or any other suitable material to carry out the function as described, having an index of refraction greater than that of air.

When the various elements are mounted as illustrated and light source 12 is turned on, tilting of refractor 32 causes the angle of incidence of each ray of light to be changed as is understood in the art.

Figure 2:
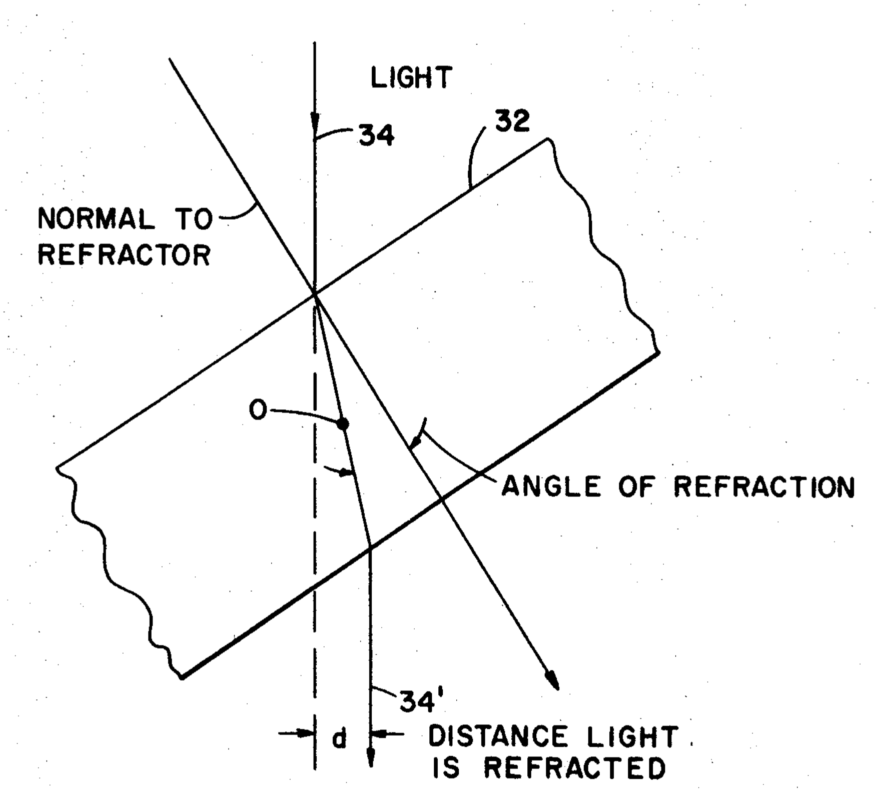
FIG. 2 demonstrates an important principle in carrying out this invention.

For a brief description of this effect reference is made to FIG. 2 where is shown a ray of light 34 directed at refractor 32. A double refraction takes place as the ray enters and then leaves refractor 32 with the result that the emerging ray 34' is displaced a short distance *d* away from the axis of ray 34, although parallel to the entering ray, without distortion. When the plane of refractor 32 is perpendicular to ray 34 as shown by a normal to refractor 32, no displacement occurs. The effect of tilting refractor 32 around a horizontal axis (or perpendicular to the axis from light 12 normal to film 26) is to play the light rays passing through negative 28 back and forth on transparency 24 away from the direction that refractor 32 is tilted. If refractor 32 is tilted along one axis (i.e., 0) and then rotated 360° around ray 34 the result is that film 26 becomes exposed around the lines shown on transparency 24.

Film 26 is then developed and utilized to photoetch a sheet having a coating of suitable conductive material such as copper. When the exposed copper is removed, the originally designed circuit remains on the board, each copper conductor surrounded by an insulated barrier whose thickness is determined by the extent refractor 32 is tilted in each direction.

Figure 3:
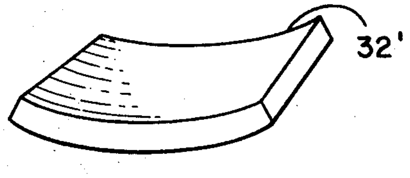
FIG. 3 shows an alternate refractor construction.
Figure 4:
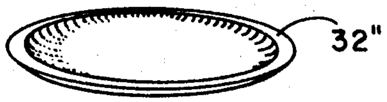
FIG. 4 shows still another alternate refractor construction.

It should be noted that with the use of a flat refractor 32 the angle of incidence over its width will vary when it is tilted, the distance *d* increasing as the distance from the light source is increased. This can be understood by noting that different rays of light have a different angle of incidence with refractor 32. Hence the width of the space surrounding each conductor on the finished circuit board will vary somewhat. If it is desired to obtain a more uniform thickness of this insulating barrier, a refractor 32' can be made a portion of a circular cylinder as shown in FIG. 3 or a segment 32'' of a hemisphere as shown in FIG. 4. Greater uniformity or certain other preferred light, displacement effects can be obtained by resorting to other possible shapes of the refractor including other than uniform thickness as would be understood by those skilled in the art.

It is thus seen that there has been provided an improved way of preparing printed circuit boards in which the conductors are defined by removal only of conductor material surrounding the lines of circuitry.

I claim:

1. A method of preparing a printed circuit board in which the board coated with a conductor material is photoetched to remove conductor material in the regions immediately surrounding the lines of circuitry, the improvement in preparing the negative for such photoetching comprising the steps of:

a. preparing a first negative showing the circuit diagram to be imprinted on said circuit board;

b. preparing a positive transparency from said first negative of the circuit diagram;

c. directing a beam of light through both said first negative and said transparency to a sheet of unexposed film, said first negative and transparency arranged to block all light to said unexposed film; and d. refracting the light from said first negative before reaching said transparency to displace the rays of light causing said film to become exposed only in the regions immediately surrounding each of the circuit lines of said circuit diagram, said film upon developing to be used as the aforesaid negative to prepare said printed circuit board.

2. The method of claim 1 in which refracting of said light is accomplished by mounting refracting means and tilting same reversibly to obtain the aforesaid displacement.

3. The method of claim 2 in which said refracting means is a flat transparent element tiltably mounted on at least one axis perpendicular to the normal extending from the source of light to said negative.

4. The method of claim 2 in which said refracting means is a segment of a circular cylinder.

5. The method of claim 2 in which said refracting means is a segment of a hollow sphere.